United States Patent [19]

Marx et al.

[11] Patent Number: 5,430,933
[45] Date of Patent: Jul. 11, 1995

[54] METHOD OF MANUFACTURING A MULTIPLE LAYER PRINTED CIRCUIT BOARD

[75] Inventors: Dieter O. Marx; Larry K. Wong, both of Kanata, Canada

[73] Assignee: Northern Telecom Limited, Montreal, Canada

[21] Appl. No.: 186,945

[22] Filed: Jan. 27, 1994

Related U.S. Application Data

[62] Division of Ser. No. 80,542, Jun. 24, 1993, Pat. No. 5,376,759.

[51] Int. Cl.⁶ .................................................. H05K 3/02
[52] U.S. Cl. .......................................... 29/846; 29/600; 29/830; 156/89; 333/264
[58] Field of Search ..................... 29/600, 830, 846; 333/204; 156/89; 264/61

[56] References Cited

U.S. PATENT DOCUMENTS

| | | | |
|---|---|---|---|
| 4,609,892 | 9/1986 | Higgins, Jr. | 29/600 X |
| 4,764,233 | 8/1988 | Ogihara | 156/89 |
| 4,930,215 | 6/1990 | Roche et al. | 333/204 X |

FOREIGN PATENT DOCUMENTS

| | | | |
|---|---|---|---|
| 1-297901 | 12/1989 | Japan | 333/204 |
| 2-170609 | 7/1990 | Japan | 333/204 |

Primary Examiner—Carl J. Arbes
Attorney, Agent, or Firm—R. J. Austin

[57] ABSTRACT

A multiple layer printed circuit board and a method of manufacturing multiple layer printed circuit boards which incorporate integral edge shielding in combination with top and bottom shielding to effectively provide a sandwich arrangement within a Faraday Cage. Electromagnetic emissions radiating from an outside surface of either the top or bottom shielding layer are substantially reduced. In one structure, a multiple layer printed circuit board having a sandwich arrangement which includes at least one inner conductive layer for providing a ground plane disposed between the outer shielding layers, the inner conductive layer being electrically connected directly to the edge shielding means and hence to the outer conductive layers. The larger and more continuous surface area provided by the direct connection to the edge shielding effectively provides an electrical connection having a low inductance and hence in operation results in all ground planes having a more constant non-varying potential.

7 Claims, 3 Drawing Sheets

METHOD OF MANUFACTURING A MULTIPLE LAYER PRINTED CIRCUIT BOARD

This is a division of patent application Ser. No. 08/080,542, filed on Jun. 24,1993, now U.S. Pat. No. 5,376,759 issued Dec. 27, 1994 by Dieter Otto Marx et al. for 1/19/95

"A MULTIPLE LAYER PRINTED CIRCUIT BOARD".

This invention relates to multiple layer printed circuit boards.

Printed circuit boards have evolved from having signal layers as top and/or bottom layers to structures having a plurality of signal layers sandwiched with insulating layers interleaved between the signal layers. Printed circuit board manufacturers often provide a plurality of metal layers internally disposed within the structure and insulated from signal layers for connection to power or ground. The signal and metal layers do not extend out to the edge of the finished printed circuit board but fall short by a predetermined distance. Thus a small three dimensional unobstructed space around the perimeter of the finished printed circuit board is made available for mechanical fasteners to fasten faceplates and printed circuit board stiffeners to the printed circuit board.

In operation, when the metal layers are connected to power or ground they are referred to as power or ground planes respectively. Power and ground planes provide a convenient way for designers using this technology to connect, where required power and/or ground to electronic components mounted on an outermost surface of the multiple layer printed circuit board and which have leads which are soldered within Plated-through holes extending through the structure. Signal layers which are disposed next to but insulated from a ground plane layer can also take advantage of well known microstrip or stripline techniques which permit engineers to control the impedance characteristics of critical signal tracks located on the signal layer. Multiple layer printed circuit boards having in the order of ten layers are now common place within the telecommunication industry.

Along with this advancement in printed circuit board technology, logic families have been developed which are orders of magnitude faster in operation than their predecessors. Integrated circuits which operate at these higher speeds, take less time to switch from a logic zero to a logic one (rise time) and from a logic one to a logic zero (fall time). It is well known within the electronic industry that there is a direct correlation between the time taken by integrated circuits to switch from one logic state to the other and the magnitude of electromagnetic emissions radiated from the associated signal tracking layer. Simply stated, faster switching times inherently mean greater radiated electromagnetic emissions from the signal layers of printed circuit boards having integrated circuits operating at these high speeds. Electromagnetic emissions radiating from a printed circuit board may corrupt signals in a second neighbouring printed circuit board or the emissions may affect local reception by neighbouring equipment of radio or television signals.

Regulatory bodies in countries around the world have in recent years placed very strict limits on the levels of electromagnetic emissions allowed to radiate from electronic equipment intended for use within these countries. Electronic equipment which does not comply with these regulated limits generally is not allowed to be used or sold within their respective countries.

Manufacturers of electronic equipment have gone to great lengths to contain and/or limit the levels of electromagnetic emissions radiating from their equipment. Some manufacturers have fabricated metal cases which support and effectively encase a complete printed circuit board in a Faraday Cage. Other manufacturers have effectively placed complete shelves of electronic equipment or even frames of equipment in Faraday Cages in an attempt to contain radiated electromagnetic emissions from their electronic equipment. Although these methods do attenuate the emissions, they are expensive, they increase the weight and physical size of the equipment and still do not solve the problem of sensitive neighbouring electronic circuitry from being corrupted by radiated emissions from another electronic circuit within the same frame or shelf.

A more recent approach to attenuating the level of emissions from electronic circuitry has been to limit it at its source; the printed circuit board. Some manufacturers of multiple layer printed circuit boards have attempted to limit electromagnetic emissions by fabricating their printed circuit boards with metal shielding layers which form the top and bottom outermost layers, the shielding layers in use being connected to ground potential. Each of the metal shielding layers has an inside conductive surface and an outside conductive surface. Electromagnetic fields associated with electrical signals originating on signal layers, may induce radio frequency currents onto the inside surfaces of the top and/or bottom metal shielding layers. Some of these radio frequency currents travel solely along the inside surfaces of the metal shielding layers but some eventually find a path to the outside surfaces. That portion of a radio frequency current that eventually travels along the outside surface of either the top or bottom shielding layers will contribute to electromagnetic emissions radiating outwardly from the multiple layer printed circuit board. Many manufacturers using printed circuit boards which incorporate top and bottom shielding layers still opt to enclose shelves or equipment cabinets containing these printed circuit boards in effectively a Faraday Cage.

A secondary, yet well known problem associated with prior art multiple layer printed circuit boards is that of ground plane impedance. Prior art multiple layer printed circuit boards having one or more internal ground planes, typically electrically connect the ground planes to the metal shielding layer on each of the top and bottom surfaces using many plated-through holes disposed in predetermined patterns across the surfaces of the printed circuit boards. Plated-through holes exhibit a high inductance connection and when in operation, these ground planes when connected in this manner very often are not all at the same voltage potential. It is desirable to have all ground planes at one common non-varying potential considering that these planes serve to provide a reference for sensitive electronic devices. Another concern of using multiple plated-through holes to provide the electrical connection between internal ground planes and the metal shielding layers is that these holes extend through the printed circuit board, and hence result in obstructions when engineers route signal tracks on signal layers within the printed circuit board.

The present invention seeks to provide a multiple layer printed circuit board which minimizes the above problems.

According to one aspect of the invention there is provided a multiple layer printed circuit board comprising a sandwich arrangement of two outer conductive layers, an electrically conducting signal layer and insulating layers disposed between the conducting layers and the signal layer, the outer conductive layers disposed so as to provide top and bottom shielding layers of the sandwich arrangement; and integral edge shielding means comprising a conductive edge shielding layer provided upon at least one edge of the sandwich arrangement, extending to the outer conductive layers and electrically connected directly to each of the outer conductive layers.

The invention defined above extends to all forms of multiple-layer printed circuit boards including back planes or panels used in electronic systems.

Where all signal layers of a multiple layer printed circuit board are used to track signals operating at high frequencies then the sandwich arrangement may be comprised by the whole printed circuit board. However, is possible for the multiple layer printed circuit board to have a certain signal layer or layers dedicated to tracking just high frequency signals and another signal layer or layers dedicated to tracking all other required signals which would not significantly contribute to electromagnetic emissions In such a case, the sandwich arrangement would be provided by certain contiguous layers, i.e. those signal layers dedicated to tracking the high frequency signals and associated insulating and outer conductive layers of the sandwich arrangement. The sandwich arrangement would then include only some of the total layers of the printed circuit board and each outer conductive layer or shielding layer of the sandwich arrangement could be disposed as an interior layer of the whole printed circuit board. All other layers could be disposed outside the sandwich arrangement and segregated from it by an insulating layer.

Advantageously the sandwich arrangement includes at least one inner conductive layer for providing a ground plane disposed between the outer shielding layers, the inner conductive layer being electrically connected directly to the edge shielding means and hence to the outer conductive layers. In operation, ground planes connected in this manner provide a ground plane having a low impedance connection to ground (i.e. to the outer shielding layers which are grounded in operation). The larger and more continuous surface area provided by the direct connection to the edge shielding means effectively provides an electrical connection having a low inductance and hence in operation results in all ground planes having a more constant non-varying potential. A second advantage resulting from connecting inner ground planes directly to the edge shielding means, is that the direct electrical connection does not provide any obstructions to engineers when routing signal tracks on signal layers within the printed circuit board during a design phase.

The edge shielding means may be provided solely on one edge or on several edges of the sandwich arrangement. The degree of shielding to emissions from induced radio frequency currents does of course depend upon the amount of edge shielding provided.

Preferably, however, the multiple layer printed circuit board comprises edge shielding means on all edge surfaces of the sandwich arrangement thus containing the majority of the induced radio frequency currents to travelling solely on the inside surfaces of the top and bottom shielding layers, provided by the two outer conductive layers and hence reducing emissions.

Providing edge shielding on all edge surfaces of a sandwich arrangement of a multiple layer printed circuit board in combination with the mop and bottom shielding layers substantially and effectively provides the sandwich arrangement with an integral Faraday Cage. In use of a printed circuit board having edge shielding on all edge surfaces, electromagnetic emissions radiating from an outside surface of either he top or bottom shielding layer are substantially reduced by containing induced radio frequency currents to travelling along only an inside surface of the top and bottom shielding layers. Induced high frequency currents travelling along the inside surface of the top and bottom shielding layers are substantially contained within the sandwich arrangement of the multiple layer printed circuit board by the shielding provided by the combination of top and bottom shielding layers and the edge shielding means. Hence, potential emissions resulting from induced radio frequency currents reaching the outside surfaces of the top and bottom shielding layers are minimized.

In one practical arrangement of a multiple layer printed circuit board the shielding material on the edge surface covers he entire edge surface except for a plurality of spaced apart edge surface regions which are devoid of the shielding means, each edge surface region having a sufficiently small width dimension to provide a desired attenuation barrier to high frequency energy. A width dimension of approximately 0.3 centimeters provides about thirty decibels of attenuation to high frequency energy in the order of one gigahertz.

Conveniently the practical arrangement may include aperture means extending through the sandwich arrangement, and conductor means extending through the aperture means and electrically interconnecting top and bottom conductive layers, the aperture means being disposed inwardly of at least one edge surface region devoid of shielding means and located to provide an attenuation barrier to high frequency energy directed toward the surface region. The aperture means may be comprised by a plurality of holes extending through the sandwich arrangement in a predetermined pattern, and the conductor means comprises an electrical conductor provided upon the inner surface of each hole. Providing aperture means inward of the edge regions devoid of conducting material further reduces the amount of radio frequency current which reaches the outside surfaces of the top and/or bottom metal shielding layers of the printed circuit board.

In another aspect of the invention there is provided a method of manufacturing a printed circuit board having multiple layers in a sandwich arrangement, the method comprising the steps of: providing a process panel having a central region representing the position of the printed circuit board and a border region outside of the central region, the process panel comprising a sandwich of signal layers and insulating layers between the signal layers; forming circuit board boundary apertures through the process panel, the apertures disposed in spaced apart positions around the central region to define bridges between the border region and the central region and with a part of each surface of each aperture providing part of an edge for the layers of the printed circuit board; providing a conductive material on all surfaces of the process panel including surfaces of the boundary apertures and bridges; and severing the printed circuit board from the process panel by cutting across the bridges from boundary aperture to boundary aperture to free the printed circuit board from the process panel, with the conductive material forming outer conductive layers as shielding layers of the sandwich arrangement of the printed circuit board and the conductive material on said surface parts of the boundary apertures forming edge shielding means on the parts of the aperture surfaces which form parts of the edge of the printed circuit board layers with edge regions produced by cutting the bridges being devoid of the conductive material.

In yet a further aspect of the invention there is provided a method of manufacturing a printed circuit board having multiple layers in a sandwich arrangement, the method comprising the seeps of: providing a process panel having a central region representing the position of the printed circuit board and a border region outside of the central region, the process panel comprising a sandwich of signal layers and insulating layers between the signal layers; forming circuit board boundary apertures through the process panel, the apertures disposed in spaced apart positions around the central region to define bridges between the border region and the central region and with a part of each surface of each aperture providing part of an edge for the layers of the printed circuit board; providing an electroless coating of copper on all surfaces of the process panel including surfaces of the boundary apertures and the bridges; forming an electroplated layer of copper upon all the surfaces of the electroless coated copper, by passing an electric current into the electroless coating on the border region, the current passing from the border region to the central region by passing along the electroless coating of the bridges, and along the electroless coating of the central region, the current also travelling along the electroless coating of the boundary apertures; and severing the circuit board from the process panel by cutting across the bridges from boundary aperture to boundary aperture, the layer of copper forming outer conductive shielding layers as part of the sandwich arrangement of the printed circuit board and the layer of copper also forming edge shielding means on the pares of the aperture surfaces which form pares of the edge of the circuit board layers with edge regions produced by cutting the bridges, being devoid of copper.

Manufacturing printed circuit boards and incorporating an electroplating process to provide the shielding on both the major surfaces and the edges is both economical and effective. The addition of one extra step to an otherwise conventional printed circuit board manufacturing process enables manufacturers of multiple layer printed circuit boards to provide an effective and substantially continuous shield around the printed circuit boards. Any added drilling such as for the aperture means need not be a separate step but an addition to an already existing drilling step.

In performance of the method, it is advantageous to provide the process panel with a conductive layer interleaved with the signal and insulating layers, the conductive layer extending outwardly into the border region in at least one location. Formation of the circuit board boundary apertures then exposes an edge of the conductive layer. The electroless coating of copper is then formed upon this exposed edge to provide an electrical connection with the subsequently applied electroplated layer. Hence, an electrical connection is provided between the conductive layer and each of the outer layers whereby plated-through holes which normally serve for grounding purposes, may be avoided thereby allowing for greater freedom of printed circuit board design.

One embodiment of the invention will now be described, by way of example, with reference to the accompanying drawings in which:

FIG. 1 is an isometric cross-sectional view of part of a end of a prior art multiple layer printed circuit board;

FIG. 2 a plan view of the prior art multiple layer printed circuit board during manufacture;

Figure 1:
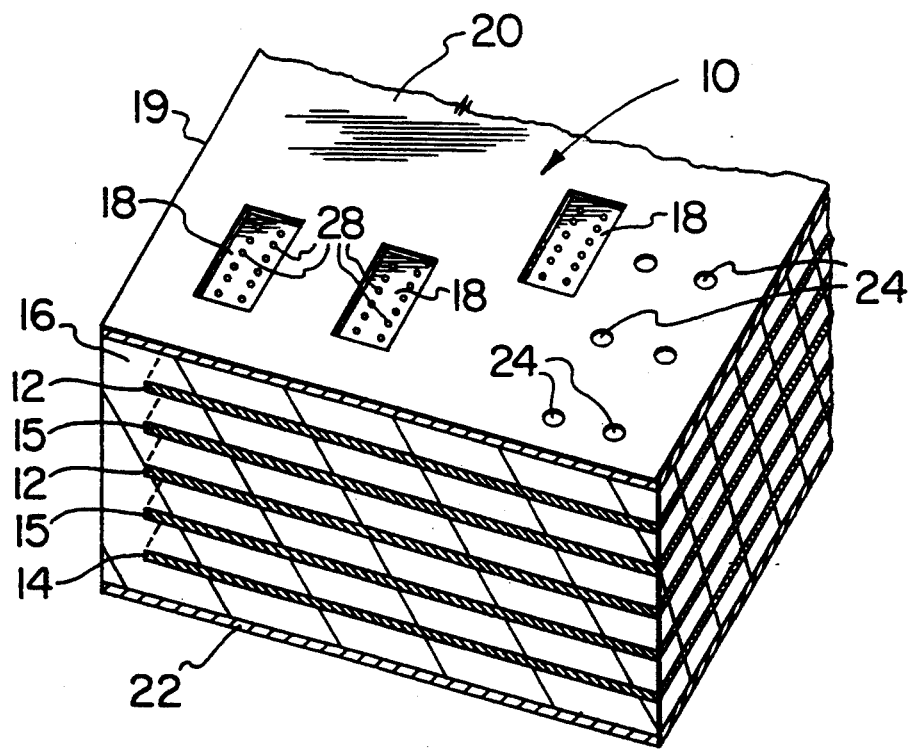

As may be seen in FIG. 1, a prior art multiple layer printed circuit board 10 comprises a sandwich arrangement having multiple internal signal layers 12, conductive layers 14 for use as power planes, and conductive layers 15 for use as ground planes. The signal layers 12 and the conductive layers 14, 15 are separated one from the other by insulating layers 16. All signal layers 12 and conductive layers 14, 15 do not extend out to the edges 19 of the finished printed circuit board 10 but fall short by a predetermined distance. This small three-dimensional unobstructed space forming the perimeter region of the finished printed circuit board is made available for mechanical fasteners to fasten faceplates and printed circuit board stiffeners to. To provide some attenuation to electromagnetic emissions radiating from internal signal layers 12, top and bottom outermost layers 20, 22 of the sandwich arrangement are also conductive layers. The top and bottom outermost conductive layers 20, 22 are typically connected to electrical ground potential when the circuit board is in operation. Plated-through holes 24 extending through the printed circuit board 10 are used to electrically connect the top outermost conductive layer 20 to the bottom outermost conductive layer 22 and to connect in known manner, those internal conductive layers 15 which are to be used as ground planes, when in operation, to the top and bottom outermost conductive layers 20, 22. Clearance holes in the layers 12 and 14 are provided also in known manner around the holes 24 to electrically isolate these layers from the plated-through holes. Integrated circuit positions 18 (shown as rectangular outlines in outermost layer 20) have associated holes 28 which are plated with a conductive layer such as copper, to provide electrical connection between integrated circuit terminal pins (not shown) and either signal layers 12 or conductive layers 14, 15 as required.

During manufacture of a multiple layer printed circuit board 10 it is conventional to use a process panel 30 (FIG. 2) from which the printed circuit board is produced. This process panel 30 is larger in plan view than the final multiple layer printed circuit board 10 (shown in chain dotted in FIG. 2), the printed circuit board 10 being surrounded in the process panel 30 by a continuous and integral border region 32. The border region 32 is required for handling the printed circuit board 10 during manufacture as will now be described. The border region 32 may conveniently be used for registration purposes during the drilling of all holes on the printed circuit board 10 and for this purpose may have registration holes 35. Accurate component hole location is critical considering that the majority of modern printed circuit boards have associated circuit components inserted into position with the use of robotics.

A conventional electroless process step is required for the purpose of preparing the process panel 30 for a subsequent and conventional electroplating step which deposits a layer of copper onto all outer surfaces of the process panel 30 including outer perimeter edges of the border region 32 and as well on all surfaces of holes 28, 24. To enable the electroless process step to be performed the process panel 30 is held in a vertical position in a bath containing a copper suspension by a clamping arrangement 33 (FIG. 2) attached to the border region 32 of the process panel 30. During the subsequent electroplating step, an electrode clamp (mechanically similar to the clamping arrangement 33) is affixed to the border region 32 along one edge of the process panel 30 to support the process panel 30 while suspended in a copper solution bath and to pass electric current to the surface of the process panel.

After completion of all manufacturing steps the multiple layer printed circuit board 10 is severed (along the chain dotted line in FIG. 2) from the process panel 30 and the border region 32 is discarded. The resulting multiple layer printed circuit board 10 (FIG. 1) has the top and bottom outermost layers 20, 22 which provide copper surfaces of the sandwich arrangement but where severed, around the chain dotted line of FIG. 2, exposed edges 19, exist which are devoid of copper.

Apart from the fact that no edge shielding is provided on this conventional board and emissions resulting from induced radio frequency currents freely take place, the whole board manufacturing process is one which is dependent upon no edge shielding being provided.

Figure 2:
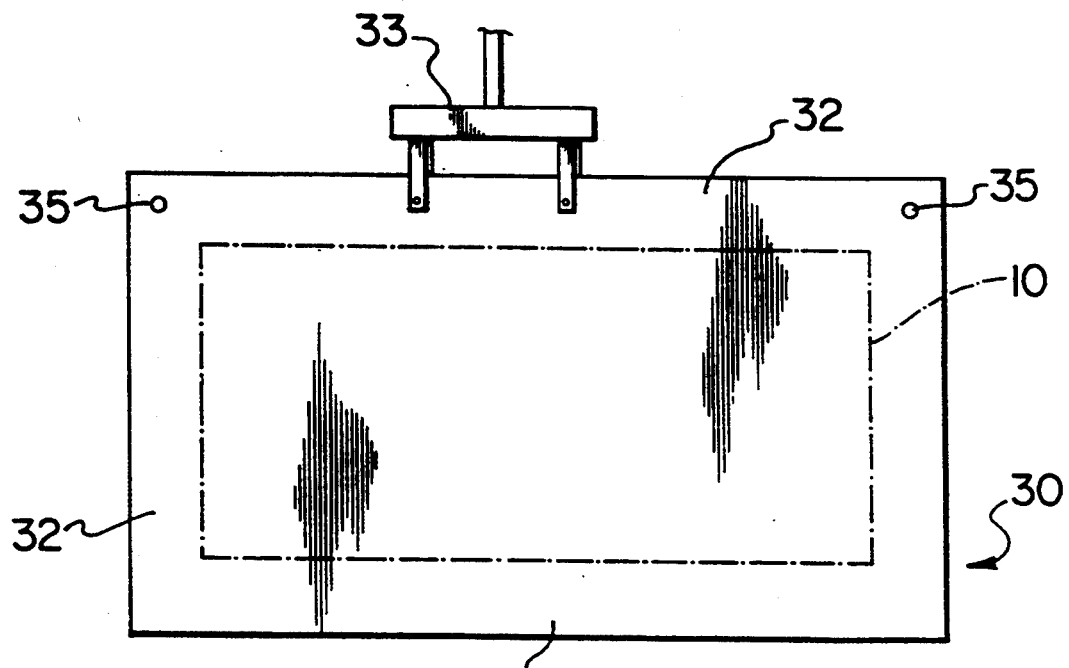

In an embodiment now to be described, parts of the structure similar to the prior are structure of FIGS. 1 and 2, carry the same reference numerals for convenience.

Figure 3:
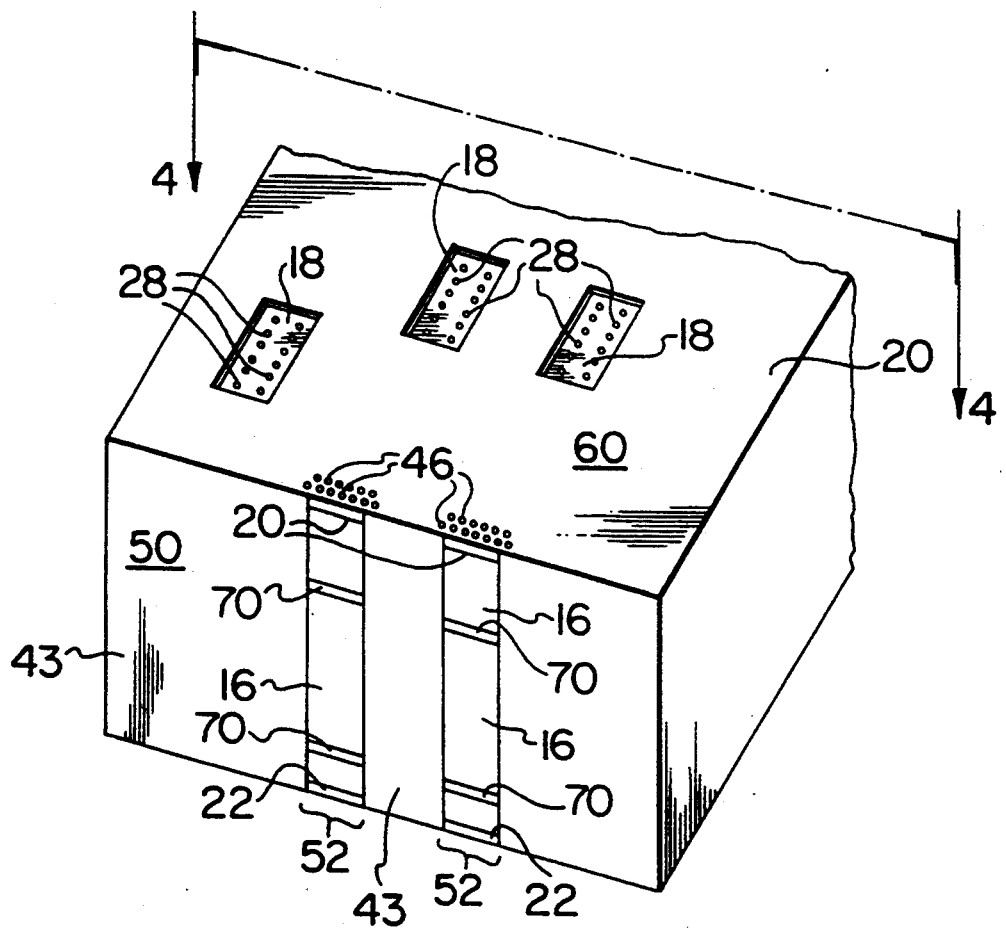
FIG. 3 is an end view of a multiple layer printed circuit board of embodiment.
Figure 4:
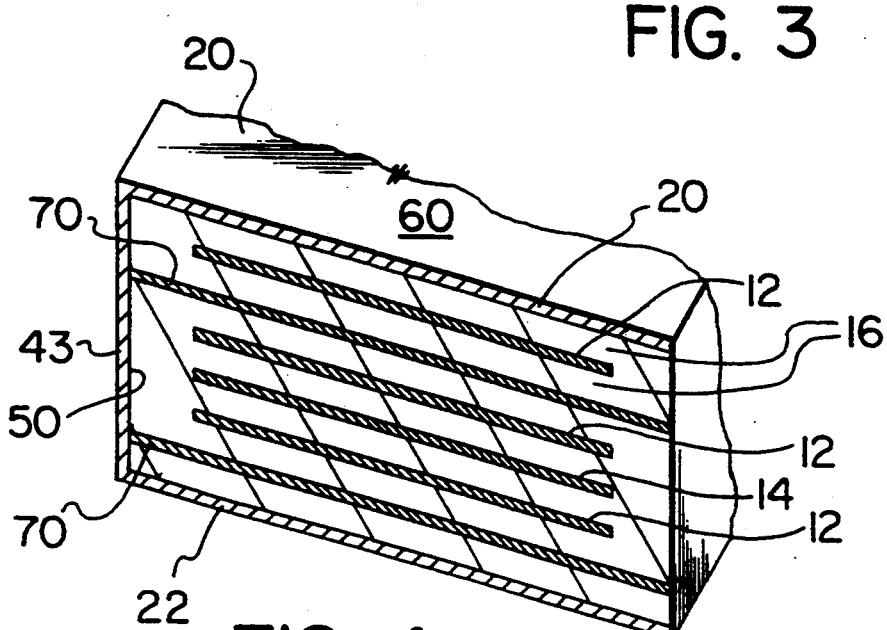
FIG. 4 is an isometric cross-sectional view of the multiple layer printed circuit board of FIG. 3 and taken along the line 4—4, of FIG. 3.

In the embodiment of the invention as shown in FIGS. 3 and 4, a multiple layer printed circuit board 60 comprises a sandwich arrangement having multiple internal signal layers 12, conductive layers 70 for use as ground planes and conductive layers 14 for use as power planes, all of which are separated one from the other by insulating layers 16. Top and bottom outermost layers 20, 22 of the sandwich arrangement are also conductive layers and are for connection to electrical ground potential when in operation. Integrated circuit positions 18 have associated plated-through holes 28 which provide electrical connection between integrated circuit terminal pins (not shown) and either signal layers 12, or conductive layers 14,70 as required. The multiple layer printed circuit board 60 differs from the prior art, in a manner now to be described.

The multiple layer printed circuit board 60 differs basically from the prior art in that it is provided with integral edge shielding means. This is provided upon each edge of the printed circuit board by a conductive edge shielding layer 43 which extends along each edge so as to cover each entire edge surface 50 of the sandwich arrangement except for a plurality of small spaced-apart edge regions 52 which are devoid of conducting material. The conductive edge shielding layer 43 of the edge surfaces 50 extends to the top and bottom outermost conductive layers 20, 22 and is electrically connected directly to each of the outer conductive layers. Except for the presence of edge regions 52, a continuous electrical connection is formed at the junction of the conductive edge shielding layer 43 and the conductive top and bottom outermost layers 20, 22. Aperture means in the form of plated-through shielding holes 46 extend through the sandwich arrangement, electrically connecting the top and bottom outermost conductive layers 20, 22 and are positioned in a predetermined pattern immediately inward of the edge regions 52 as is shown in FIG. 3. The shielding holes 46 are positioned in two rows, with the holes of the rows being staggered from row to row along the lengths of the rows.

The edge regions 52 are devoid of conducting material for reasons relating to a process or method of manufacturing multiple layer printed circuit boards, yet to be described. The edge regions 52 being devoid of conductive material effectively form a break in the conductive shielding layer 43 but if the width of these edge regions 52 is kept to a minimum, effective shielding is still achieved. Edge regions having a width of about 0.3 centimeters provide more than 30 decibels of attenuation to high frequency energy in the order of about one gigahertz ($1 \times 10^{*}9$ Hz). The potential for further attenuation is possible by the addition of the shielding holes 46. The spacing between the shielding holes can easily be made to be significantly smaller than the width of the edge regions 52 as they are simply drilled holes and hence if positioned in a manner as shown in FIGS. 3 or 5 and inward of the edge regions 52, they effectively reduce the break or opening in the conductive shielding layer 43 formed by the edge regions 52 and thus further reduce the chance of induced radio frequency currents travelling on the inside surface of either the top or bottom conductive outermost surfaces from reaching and travelling along the outside surfaces and contributing to radiated emissions.

Internally, the signal layers 12 and conductive layers 14 do not extend to the edges of the board 60 and are thus similar to the prior art structure of FIGS. 1 and 2. Thus they are spaced apart from the edge shielding layer 43 as shown by FIG. 4. However, in the embodiment, the conductive layers 70 intended to be used as ground planes do extend outwardly to the edge surfaces 50 to be electrically connected with and merge into the edge shielding layer 43.

Figure 5:
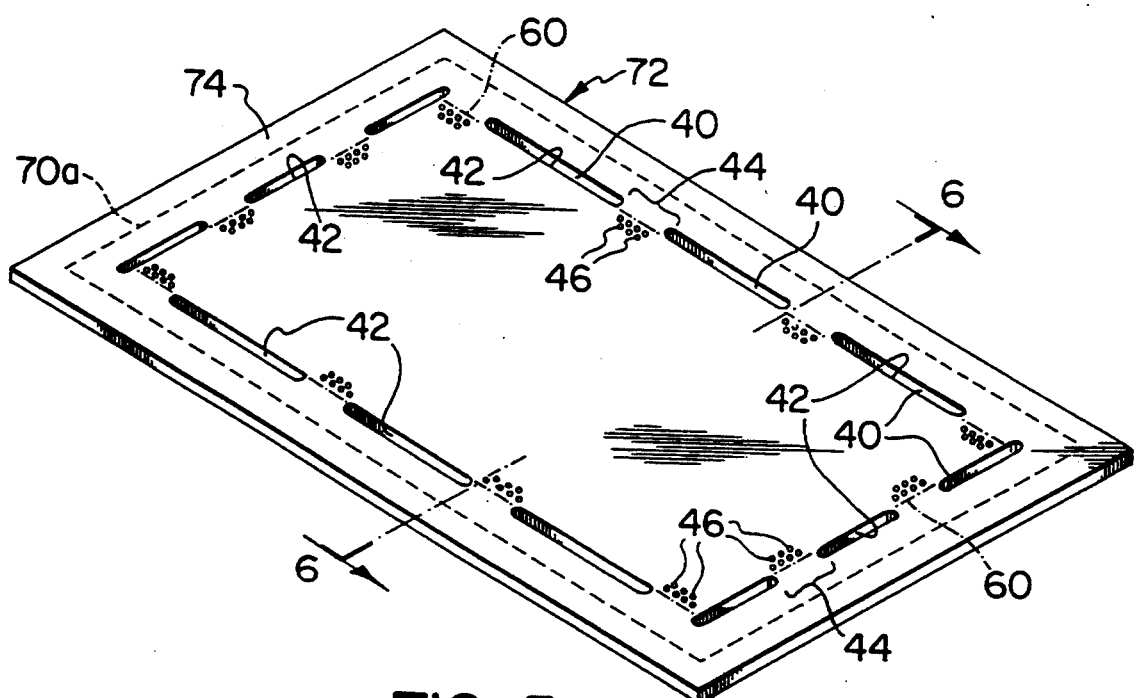
FIG. 5 is a plan view of the multiple layer printed circuit board of the embodiment at one stage during manufacture.

The multiple layer printed circuit board 60 is made from a process panel 72, as shown in FIG. 5 and is basically constructed in layers using conventional techniques. One significant difference in construction of the process panel 72 is that all conductive layers 70 to be used as ground planes are provided by original process panel layers 70a which, as shown in chain dot in FIG. 5 and in solid in FIG. 6, extend beyond the final dimensions of the multiple layer printed circuit board 60 (shown in chain dot in FIGS. 5 and 6) and into a border region 74. All conductive layers 14 and signal layers 12 stop short in conventional fashion of the final dimensions of the multiple layer printed circuit board 60.

The process panel in a substantially finished stage would include all holes 28, 46 such as for component terminal pins, shielding, connectivity purposes and mechanical fasteners. etc., to be drilled in the appropriate positions.

Figure 6:
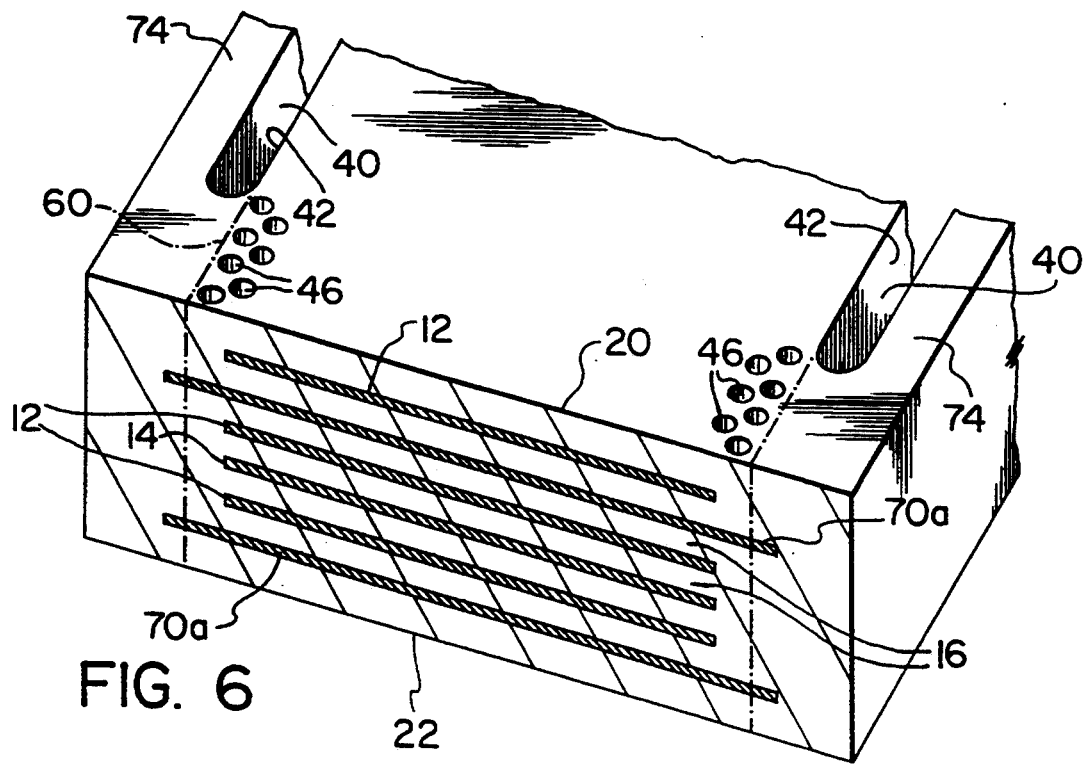
FIG. 6 is a cross-sectional view of the multiple layer printed circuit board of FIG. 5 at the manufacturing stage and taken along the line 6—6 of FIG. 5.

Predetermined locations on the process panel 72 are routed in the border region 74 to provide circuit board boundary apertures. These are in the form of a plurality of in-series slots 40 which extend through the sandwich arrangement. The slots 40 are located and orientated such that their inwardly disposed side surfaces 42 form parts of edges 50 of the final multiple layer printed circuit board 60. Formation of the slots 40 cuts through and exposes cut edges of all conductive layers 70a along the inwardly disposed side surface 42 of each slot 40. The side surfaces 42 are longer than the widths of the bridges 44. Predetermined spaces or bridges 44 between adjacent slots 40 are required so that the printed circuit board 60 may still be structurally supported by the process panel 72, during the remainder of the manufacturing process. Aperture means, in the form of shielding holes 46 are drilled through the sandwich arrangement in a predetermined pattern immediately inward of the bridges 44 as is shown in FIGS. 5 and 6. The shielding holes 46 are positioned in two rows, with the holes of the rows being staggered as previously mentioned.

An electroless step is performed which provides a conductive coating on all external surfaces of the process panel 72 including the surfaces of all slots 40 and the surfaces of all apertures including the shielding holes 46. The electroless process step prepares the process panel 72 for a subsequent electroplating step.

The electroplating step involves securing an electrode clamping arrangement (not shown) similar to that shown in FIG. 2, onto the border region 74, submersing the process panel 72 into a bath containing for example, a copper solution and passing a current to the surface of the process panel which is sufficient for electroplating. Electroplating the process panel 72 provides all exposed surfaces, (i.e. the conductive coating) of the panel 72 to be plated with a substantial layer of copper. For example the electroplating step provides the top and bottom outermost conductive layers 20, 22; it provides a conductive layer on the surfaces of the slots 40 which is integral with the layers 20, 22 as they are formed simultaneously. In addition, the copper layers on the inwardly disposed surfaces 42 of the slots, forms an electrical contact with the exposed cut edges of all conductive layers 70 along the inwardly disposed surface 42 of each slot 40. The electroplating step would also provide the conductive means through the aperture means by effectively plating the surfaces of the shielding holes 46.

Freeing the multiple layer printed circuit board 60 from the process panel 72 is achieved by simply severing across each bridge 44 on each of the four sides of the multiple layer printed circuit board 60 along a line which is colinear with the inward disposed surface 42 of a corresponding slot 40. The finished multiple layer printed circuit board 60 of FIG. 3 has edge surfaces 50 coated with conductive edge shielding layers 43 formed by the plating on inward disposed surfaces 42 of the sloes 40 and severed edge regions 52 produced across the bridges 44 and which are devoid of conductive material and hence expose a small portion of the sandwich arrangement; the conductive (electroplated) edge shielding layers 43 being integral with the top and bottom conductive layers 20, 22.

The number of bridges 44, or more importantly the total surface area of the bridges 44 should be sufficient to provide a low resistance path for required electroplating current to pass from the electrode clamps (not shown) via the border region 74, to form the top and bottom outermost layers 20, 22 and to electroplate the surfaces 42 of the slots 40. As previously stated, it is desirable that for reduced emissions, the width of the bridges 44 or the spacing between the slots be kept to a minimum so as o produce narrow edge regions 52. From an emissions point of view it is preferable to have multiple slots having relatively small associated bridges than it is to have a few longer slots and having larger bridges.

The outermost layers 20, 22 of the sandwich arrangement need not be the outermost surfaces of the multiple-layer printed circuit board. In a further embodiment of the invention (not shown) a multiple-layer printed circuit board has one or more insulating or signal layers disposed outside the sandwich arrangement. It is conceivable to only require shielding of certain signal layers which in operation would be likely to contribute to emissions. Such signal layers would be part of the sandwich arrangement and thus shielded while signal layers which in operation would be less likely to contribute to emissions and/or insulating layers could lie outside the sandwich arrangement to form the rest of the thickness of the printed circuit board.

As an alternative to the aperture means or shielding holes 46 or in combination with the shielding holes 46, the regions devoid of conductive material 52 could easily be coated in a separate process step with a copper (conductive) paint-like material to effectively form continuous edge shielding which is also integral with the top and bottom surfaces 20, 22.

In a further embodiment (not shown), in a multiple layer printed circuit board, the multiple shielding holes 46 are replaced with a narrow sloe disposed inward of the region of the edge region 52 and which overlap portions of the edge shielding layer 43 on either side of the regions 52.

In operation the combined shielding provided by the top and bottom outermost layers 20, 32 and the edge shielding provided by the edge shielding layer 43 and by the shielding holes 46 substantially contain induced high frequency currents within the sandwich and hence reduce radiated emissions from the multiple layer printed circuit board.

In operation, conductive layers 70 for use as ground planes which are connected directly to the edge shielding layer 43 and hence are connected to the outer shielding layers 20, 22 provide ground planes having low impedance paths to ground potential. The large and substantially continuous surface area provided by the direct connection to the edge shielding layers of the layers 70 results in all ground planes within a multiple layer printed circuit board, when in operation, having a more constant and non-varying potential from one ground plane to the next. As well, directly connecting ground planes in this manner does not provide any obstructions to a designer during a design phase, when routing signal tracks on signal layers of the multiple layer printed circuit board. In other words, plated-through holes for ground connection of ground planes, are avoided.

We claim:

1. A method of manufacturing a printed circuit board having multiple layers in a sandwich arrangement, the method comprising the steps of:
   providing a process panel having a central region representing the position of the printed circuit board and a border region outside of the central region, the process panel comprising a sandwich of signal layers and insulating layers between the signal layers;

forming circuit board boundary apertures through the process panel, the apertures disposed in spaced apart positions around the central region to define bridges between the border region and the central region and with a part of each surface of each aperture providing part of an edge for the layers of the printed circuit board;

providing a conductive material on all surfaces of the process panel including surfaces of the boundary apertures and bridges; and severing the printed circuit board from the process panel by cutting across the bridges from boundary aperture to boundary aperture to free the printed circuit board from the process panel, with the conductive material forming outer conductive layers as shielding layers of the sandwich arrangement of the printed circuit board and the conductive material on said surface parts of the boundary apertures forming edge shielding means on the parts of the aperture surfaces which form parts of the edge of the printed circuit board layers with edge regions produced by cutting the bridges, being devoid of the conductive material.

2. A method according to claim 1 comprising coating the devoid edge regions with a conductive material to provide a continuous edge shielding means, after severing of the printed circuit board from the process panel.

3. A method of manufacturing a printed circuit board having multiple layers in a sandwich arrangement, the method comprising the steps of:

providing a process panel having a central region representing the position of the printed circuit board and a border region outside of the central region, the process panel comprising a sandwich of signal layers and insulating layers between the signal layers;

forming circuit board boundary apertures through the process panel, the apertures disposed in spaced apart positions around the central region to define bridges between the border region and the central region and with a part of each surface of each aperture providing part of an edge for the layers of the printed circuit board;

providing an electroless coating of copper on all surfaces of the process panel including surfaces of the boundary apertures and the bridges;

forming an electroplated layer of copper upon all the surfaces of the electroless coated copper by passing an electric current into the electroless coating on the border region, the current passing from the border region to the central region by passing along the electroless coating of the bridges, and along the electroless coating of the central region, the current also travelling along the electroless coating of the boundary apertures; and severing the circuit board from the process panel by cutting across the bridges from boundary aperture to boundary aperture, the layer of copper forming outer conductive shielding layers as part of the sandwich arrangement of the printed circuit board and the layer of copper also forming edge shielding means on the parts of the aperture surfaces which form parts of the edge of the circuit board layers with edge regions produced by cutting the bridges, being devoid of copper.

4. A method according to claim 3 comprising forming the printed circuit board boundary apertures as slots, the slots oriented each with its surface along a side of the slot providing part of an edge for the layers of the printed circuit board and with the slots being spaced apart at their ends to form the bridges.

5. A method according to claim 4 comprising spacing apart the ends of the slots such that after severing between the slots, each of the edge regions produced by severing has a maximum width between edge shielding means of about 0.3 centimeters.

6. A method according to claim 3 comprising:

providing the process panel with a conductive layer interleaved with the signal and insulating layers, the conductive layer extending outwardly into the border region in at least one location;

during formation of the circuit board boundary apertures, forming at least one aperture through the conductive layer at said at least one location so that an edge of the conductive layer produced by aperture formation is exposed at said part of the aperture; and providing the electroless coating of copper upon said part of the aperture and into conductive engagement with the edge of the conductive layer to provide electrical connection between the conductive layer and the electroplated layer of copper.

7. A method according to claim 3 comprising forming circuit board boundary apertures such that after severing the printed circuit board from the process panel the part of each surface of each aperture which forms part of the edge of the printed circuit board is longer than the severed bridge region.

* * * * *